（12）United States Patent
Kim et al.

(10) Patent No.: US 9,000,460 B2
(45) Date of Patent: Apr. 7, 2015

(54) SEMICONDUCTOR LIGHT EMITTING DEVICE

(71) Applicant: Samsung Electronics Co., Ltd., Suwon-si, Gyeonggi-do (KR)

(72) Inventors: Nam Sung Kim, Chungcheongnam-do (KR); Dong Ik Shin, Gyeonggi-do (KR); Hyun Wook Shim, Gyeonggi-do (KR); Dong Joon Kim, Gyeonggi-do (KR); Young Sun Kim, Gyeonggi-do (KR); Jung Seung Yang, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 105 days.

(21) Appl. No.: 13/712,656

(22) Filed: Dec. 12, 2012

(65) Prior Publication Data

US 2013/0146842 A1 Jun. 13, 2013

(30) Foreign Application Priority Data

Dec. 13, 2011 (KR) ........................ 10-2011-0133592

(51) Int. Cl.
*H01L 33/00* (2010.01)
*H01L 33/06* (2010.01)
H01L 33/14 (2010.01)
H01L 33/32 (2010.01)

(52) U.S. Cl.
CPC .................. *H01L 33/06* (2013.01); *H01L 33/14* (2013.01); *H01L 33/32* (2013.01)

(58) Field of Classification Search
None
See application file for complete search history.

(56) References Cited

U.S. PATENT DOCUMENTS

| | | | |
|---|---|---|---|
| 2002/0017696 A1* | 2/2002 | Nakayama et al. ........... | 257/471 |
| 2002/0182791 A1* | 12/2002 | Yoshida ......................... | 438/194 |
| 2003/0136970 A1* | 7/2003 | Takeya et al. .................. | 257/90 |
| 2003/0183827 A1* | 10/2003 | Kawaguchi et al. ............ | 257/79 |
| 2005/0214992 A1* | 9/2005 | Chakraborty et al. ......... | 438/172 |
| 2009/0101927 A1* | 4/2009 | Kohda ............................ | 257/97 |
| 2011/0133175 A1 | 6/2011 | White et al. | |

FOREIGN PATENT DOCUMENTS

| | | |
|---|---|---|
| KR | 10-2005-0037084 | 4/2005 |
| KR | 10-2007-0013320 A | 1/2007 |
| KR | 10-2009-0002195 | 1/2009 |

* cited by examiner

*Primary Examiner* — Bilkis Jahan
*Assistant Examiner* — Kevin Quinto
(74) *Attorney, Agent, or Firm* — McDermott Will & Emery LLP

(57) ABSTRACT

A semiconductor light emitting device includes first conductivity type and second conductivity type semiconductor layers, an active layer disposed between the semiconductor layers and having a structure in which one or more quantum well layers and one or more quantum barrier layers are alternately disposed An electron blocking layer is disposed between the active layer and the second conductivity type semiconductor layer. A capping layer is disposed between the active layer and the electron blocking layer and blocking a dopant element from being injected into the active layer from the second conductivity type semiconductor layer.

13 Claims, 3 Drawing Sheets

SEMICONDUCTOR LIGHT EMITTING DEVICE

CROSS-REFERENCE TO RELATED APPLICATIONS

This application claims the priority to Korean Patent Application No. 10-2011-0133592 filed on Dec. 13, 2011, in the Korean Intellectual Property Office, the disclosure of which is incorporated herein by reference.

TECHNICAL FIELD

The present application relates to a semiconductor light emitting device.

BACKGROUND

A light emitting diode (LED),-a type of semiconductor light emitting device, is a semiconductor device capable of generating light of various colors according to electron hole recombination at p- and n-type semiconductor junctions when an electrical current is applied thereto. Compared with a filament-based light emitting device, a semiconductor light emitting device has various advantages such as a long lifespan, low power consumption, excellent initial driving characteristics, and the like, and accordingly, demand for semiconductor light emitting devices continues to grow. In particular, recently, a group III-nitride semiconductor capable of emitting short-wavelength blue light has come to prominence.

An LED generally includes a structure in which an active layer is disposed between n-type and p-type semiconductor layers, and in this case, a p-type dopant included in the p-type semiconductor layer may be diffused into the active layer to degrade performance. Namely, in an LED, the quality of the active layer serving as a light emitting region in the LED is of significance, but the dopant element diffused into the active layer during a p-type semiconductor layer growth process may degrade crystal quality in the active layer or hinder the realization of an intended emission wavelength (or an intended excitation wavelength), efficiency, and the like.

Thus, a need exists in the art to provide a semiconductor light emitting device that minimizes the amount of p-type dopant diffused into an active layer to prevent crystal quality degradation and performance degradation.

SUMMARY

An aspect of the present application provides a semiconductor light emitting device having a capping structure in which a p-type dopant is blocked from being diffused into an active layer to enhance the doping efficiency of a p-type semiconductor layer while minimizing a degradation of crystal quality and hole injection efficiency.

However, an object of the present application is not limited thereto and any objects and effects that can be recognized from the technical solutions and examples described hereinafter may be included even if not clarified.

According to an aspect of the present application, there is provided a semiconductor light emitting device including: n-type and p-type semiconductor layers; an active layer disposed between the n-type and p-type semiconductor layers and having a structure in which single or a plurality of quantum well layers and quantum barrier layers are alternately disposed; an electron blocking layer disposed between the active layer and the p-type semiconductor layer; and a capping layer disposed between the active layer and the electron blocking layer and blocking a p-type dopant element from being injected into the active layer.

The capping layer may be made of a material having a lattice constant smaller than that of a material used to form the quantum barrier layer.

The capping layer may be made of a material having an energy band gap higher than that of the material used to form the quantum barrier layer.

The capping layer may include a region made of $Al_xGa_{1-x}N$ ($0<x\leq1$), and the quantum barrier layer may include a region made of GaN.

The capping layer may include a region made of $Al_xIn_yGa_{1-x-y}N$ ($0<x\leq1$, $0\leq y<1$), and the quantum barrier layer may include a region made of $Al_aIn_bGa_{1-a-b}N$ ($0\leq a<x$, $0\leq b<1$).

The capping layer may be made of a p-type semiconductor material.

The capping layer may be made of an undoped semiconductor layer.

The capping layer may include a first layer and a second layer having an energy band gap lower than that of the first layer.

The first layer may be disposed to be in contact with the active layer, and the second layer may be disposed between the first layer and the electron blocking layer.

The first layer may include a region made of $Al_xGa_{1-x}N$ ($0<x\leq1$), and the second layer may include a region made of GaN.

The first layer may include a region made of $Al_xIn_yGa_{1-x-y}N$ ($0<x\leq1$, $0\leq y<1$), and the second layer may include a region made of $Al_aIn_bGa_{1-a-b}N$ ($0\leq a<x$, $0\leq b<1$).

The electron blocking layer may have a material having an energy band gap higher than that of the p-type semiconductor layer.

The electron blocking layer may have a structure in which two or more layers each having a different energy band gap are alternately laminated.

The electron blocking layer may have a superlattice structure in which two or more layers each having a different energy band gap are alternately laminated.

In another example, a semiconductor light emitting device is provided. The device includes a first conductivity type semiconductor layer; a second conductivity type semiconductor layer; and an active layer disposed between the first conductivity type and second conductivity type semiconductor layers. The active layer has one or more quantum well layers and one or more quantum barrier layers are alternately disposed. An electron blocking layer is disposed between the active layer and the second conductivity type semiconductor layer. A capping layer' is disposed between the active layer and the electron blocking layer. The capping layer blocks a dopant element from being injected into the active layer from the second conductivity type semiconductor layer.

Additional advantages and novel features will be set forth in part in the description which follows, and in part will become apparent to those skilled in the art upon examination of the following and the accompanying drawings or may be learned by production or operation of the examples. The advantages of the present teachings may be realized and attained by practice or use of various aspects of the methodologies, instrumentalities and combinations set forth in the detailed examples discussed below.

BRIEF DESCRIPTION OF THE DRAWINGS

The drawing figures depict one or more implementations in accord with the present teachings, by way of example only, not by way of limitation. In the figures, like reference numerals refer to the same or similar elements.

DETAILED DESCRIPTION

Figure 1:
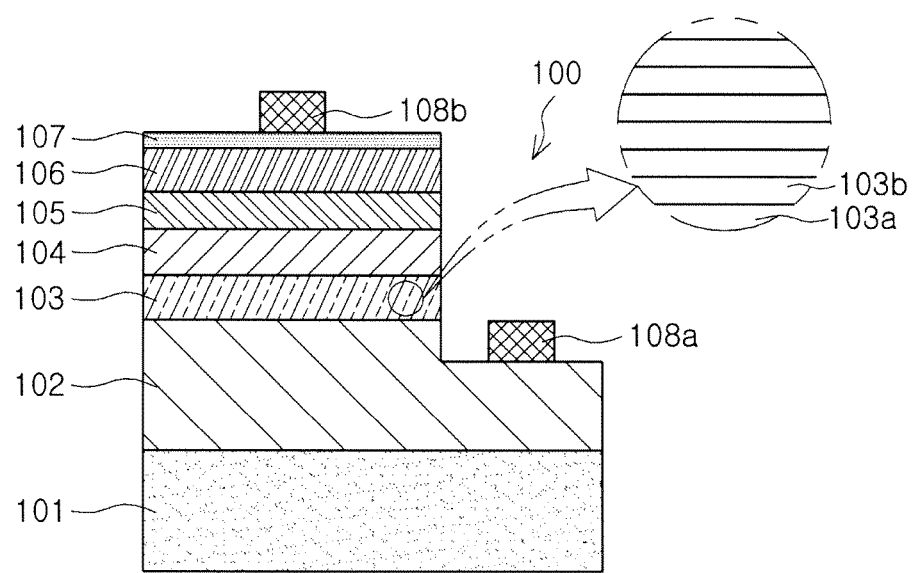
FIG. 1 is a cross-sectional view schematically showing a semiconductor light emitting device according to an example of the present application.

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

Examples of the present application will now be described in detail with reference to the accompanying drawings.

The application may, however, be embodied in many different forms and should not be construed as being limited to the examples set forth herein. Rather, these examples are provided so that this disclosure will be thorough and complete, and will fully convey the scope of the application to those skilled in the art. In the drawings, the shapes and dimensions of elements may be exaggerated for clarity, and the same reference numerals will be used throughout to designate the same or like components.

Figure 2:
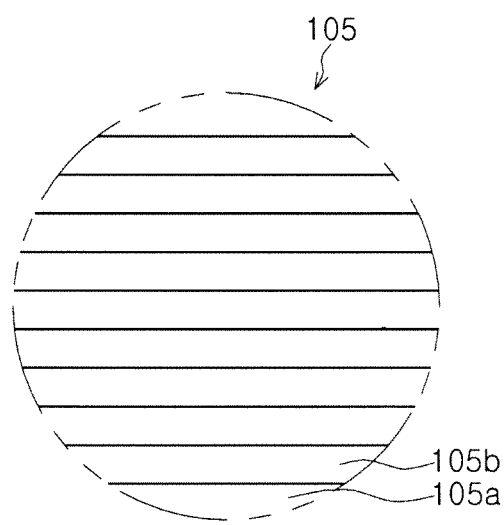
FIG. 2 is an enlarged view of an electron blocking layer that may be employed in the semiconductor light emitting device of FIG. 1.
Figure 3:
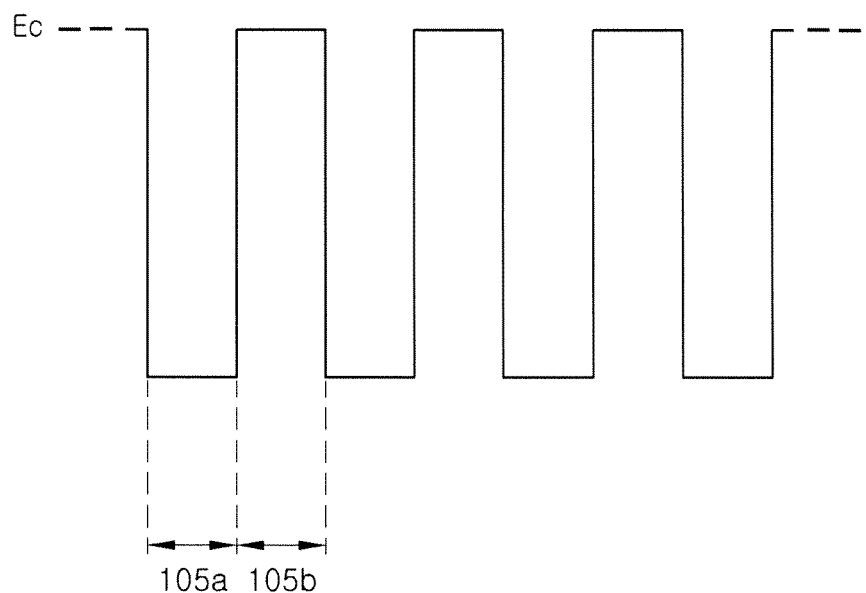
FIG. 3 is a diagram of an energy band in the periphery of the electron blocking layer of FIG: 2.

FIG. 1 is a cross-sectional view schematically showing a semiconductor light emitting device according to an example of the present application. FIG. 2 is an enlarged view of an electron blocking layer that may be employed in the semiconductor light emitting device of FIG. 1. FIG. 3 is a diagram of an energy band in the periphery of the electron blocking layer of FIG. 2. With reference to FIG. 1, a semiconductor light emitting device 100 according to the present example includes a substrate 101, an n-type semiconductor layer 102, an active layer 103, a capping layer 104, an electron blocking layer 105, a p-type semiconductor layer 106, and an ohmic-electrode layer 107. First and second electrodes 108a and 108b may be disposed on upper surfaces of the n-type semiconductor layer 102 and the ohmic-electrode layer 107, respectively. Here, terms such as 'upper portion', 'upper surface', 'lower portion', 'lower surface', 'lateral surface', or the like, are used based on the directionality of the drawings, which may be changed according to the direction in which the device is actually disposed in use. Also, as for subscripts such as x, y, z, or the like, used in empirical formulas as described hereinafter, although the same subscripts are used for different materials, they are unrelated to each other unless otherwise mentioned.

The substrate 101 is a semiconductor growth substrate. As the substrate 101, a substrate made of an insulating, conductive, or semiconductive material such as sapphire, Si, SiC, $MgAl_2O_4$, MgO, $LiAlO_2$, $LiGaO_2$, GaN, or the like, may be used. In this case, sapphire having electrical insulation characteristics may most preferably be used. Sapphire is a crystal having Hexa-Rhombo R3c symmetry, of which lattice constants in c-axis and a-axis directions are 13.001 Å and 4.758 Å, respectively. A sapphire crystal has a C (0001) plane, an A (1120) plane, an R (1102) plane, and the like. In this case, a nitride thin film can be relatively easily disposed on the C plane of the sapphire crystal, and because sapphire crystal is stable at high temperatures, it is commonly used as a material for a nitride growth substrate. Here, however, when the nitride thin film is grown from the C plane, a strong electrical field may be formed in the nitride thin film due to a piezoelectric effect. Meanwhile, a silicon (Si) substrate may appropriately be used as the substrate 101, and mass-production can be facilitated by using the silicon (Si) substrate which may have a large diameter and be relatively inexpensive. When the silicon (Si) substrate is used, a nucleation layer made of a material such as $Al_xGa_{1-x}N$ ($0 \leq x \leq 1$) may be disposed on the substrate 101 and a nitride semiconductor having a desired structure may be grown on the nucleation layer.

The n-type and p-type semiconductor layers 102 and 106 may be made of a nitride semiconductor, e.g., a material having a composition of $Al_xIn_yGa_{1-x-y}N$ ($0 \leq x \leq 1$, $0 \leq y \leq 1$, $0 \leq x+y \leq 1$). Each of the semiconductor layers 102 and 106 may be configured as a single layer or may include a plurality of layers each having different characteristics such as a doping concentration, a composition, or the like. The n-type and p-type semiconductor layers 102 and 106 may be made of an AlInGaP or AlInGaAs semiconductor, besides the nitride semiconductor. The active layer 103, disposed between the n-type and p-type semiconductor layers 102 and 106, emits light having a certain energy level, according to the recombination of electrons and holes and may have a multi-quantum well (MQW) structure in which quantum well layers 103a and quantum barrier layers 103b are alternately laminated. Here, in the case of the nitride semiconductor, the quantum well layers 103a may be made of InGaN (the content of In and Ga may be variable) and the quantum barrier layers 103b may include regions made of GaN, InGaN (the content of In and Ga may be variable and the content of In may be less than that of the quantum well layers), AlInGaN (the content of Al, In, and Ga may be variable), or the like.

The n-type and p-type semiconductor layers 102 and 106 and the active layer 103 constituting the light emitting structure may be grown by using a conventional process, such as metal organic chemical vapor deposition (MOCVD), hydride vapor phase epitaxy (HVPE), molecular beam epitaxy (MBE), and the like. Also, although not shown, in order to lessen stress acting on the n-type semiconductor layer 102 to thus enhance crystallinity, a buffer layer may be disposed on the substrate 101 before the n-type semiconductor layer 102 is formed.

The electron blocking layer 105 serves to prevent an occurrence of an overflow by blocking electrons injected from the active layer 103 to increase recombination efficiency in the active layer 103, and to this end, the electron blocking layer 105 may include a material having an energy band gap higher than that of a material used for forming the p-type semiconductor layer 106. For example, when the p-type semiconductor layer 106 is made of GaN, the electron blocking layer 105 may be made of $Al_xGa_{1-x}N$ ($0<x \leq 1$). Also, the electron blocking layer 105 may be configured as a single layer or may include layers each having a different energy band gap. Namely, as shown in FIGS. 2 and 3, the electron blocking layer 105 may include a well-layer 105a and a barrier layer 105b, and here, single or a plurality of well layers 105a and barrier layers 105b may be alternately disposed. In this case, the barrier layer 105b may include a region made of $Al_x$-

$In_yGa_{1-x-y}N$ (0<x≤1, 0≤y<1) and the well layer 105a may include a region made of $Al_aIn_bGa_{1-a-b}N$ (0≤a<x, 0≤b<1). In addition, the alternate disposition structure of the well layers 105a and the barrier layers 105b may have a superlattice structure, thereby effectively securing an electron blocking function in the electron blocking layer 105 and reducing a degradation of crystallinity. Also, in the present example, the electron blocking layer 105 has the structure in which the two layers are alternately laminated, but the present application is not limited thereto and the electron blocking layer 105 may have a structure in which three layers each having a different energy band gap, e.g., an AlGaN/GaN/InGaN structure, or the like.

In the present example, the capping layer 104 is disposed between the active layer 103 and the electron blocking layer 105, and the capping layer 104 serves to block a p-type impurity such as magnesium (Mg), or the like, from being diffused from the electron blocking layer 105, the p-type semiconductor layer 106, or the like, from being injected into the active layer 103. If the p-type impurity is diffused into the active layer 103, crystallinity of the active layer 103 could possibly be degraded and non-radiative recombination would possibly be increased. Thus, in addition to the electron blocking layer 105, the capping layer 104 is disposed to be adjacent to the active layer 103 to protect the active layer 103 against the p-type impurity. In order to perform the diffusion blocking function, the capping layer 104 may be made of a material having a smaller lattice constant than that of a material used for the quantum barrier layer 103b included in the active layer 103. In a similar vein, the capping layer 104 may be made of a material having an energy band gap higher than that of the quantum barrier layer 103b included in the active layer 103.

As for materials satisfying such conditions, for example, the capping layer 104 may include a region made of $Al_xGa_{1-x}N$ (0<x≤1), and the quantum barrier layer 103b may include a region made of GaN. Also, the capping layer 104 and the quantum barrier layer 103b may include indium (In). For example, the capping layer 104 may include a region made of $Al_xIn_yGa_{1-x-y}N$ (0<x≤1, 0≤x<1), and the quantum barrier layer 103b may include a region made of $Al_aIn_bGa_{1-a-b}N$ (0≤a<x, 0≤b<1). In this case, if the content of aluminum (Al) is excessively increased, crystallinity of the capping layer 104 and a layer grown thereon could possibly be degraded, so in consideration of the p-type impurity diffusion blocking function, the content (x, a) of aluminum (Al) may be 0.20 or less.

Meanwhile, the capping layer 104 may be made of a p-type semiconductor or an undoped semiconductor. Here, the undoped state refers to a state in which doping has not been performed on purpose. In particular, in a case in which the capping layer 104 is made of a p-type semiconductor, the capping layer 104 may be made of a p-type semiconductor material when it starts to be grown, or the capping layer 104 may be made of an undoped semiconductor material and then a p-type impurity may be injected thereinto through diffusion. In this manner, the capping layer 104 may be formed such that a portion of gallium (Ga) of GaN is substituted with aluminum (Al), and here, the case in which a portion of gallium (Ga) is substituted with aluminum (Al) has a relatively small lattice constant, enhancing barrier characteristics with respect to diffusion of the p-type impurity (e.g., magnesium (Mg)). Also, in comparison to GaN, a binary material, a ternary material such as aluminum (Al), gallium (Ga), and nitrogen (N) has increased bonding force in comparison to GaN, so inter-substitutional diffusion by the p-type impurity can be also reduced. Thus, diffusion of the p-type impurity toward the active layer 103 can be effectively blocked by using the capping layer 104 made of such a material (e.g., the ternary material including aluminum (Al)).

Owing to the p-type impurity diffusion blocking function of the capping layer 104, the active layer 103 can be prevented from being degraded, thus enhancing luminescent properties. Also, the capping layer 104 proposed in the present example, although not having a great thickness, can effectively block the p-type impurity, so an increase in a driving voltage due to the addition of the capping layer 104 can be minimized. Another effect of the presence of the capping layer 104 is increasing the concentration of the p-type impurity in the electron blocking layer 105 or the p-type semiconductor layer 106 since the p-type impurity is prevented from being diffused, and accordingly, concentration of the p-type impurity can be sufficiently secured to increase the number of holes participating in light emission, thus enhancing electrical characteristics and luminescent properties. In addition, as mentioned above, the capping layer 104 having a relatively high value of energy band gap can effectively restrain overflow of electrons together with the electron blocking layer 105.

The other remaining components will be described with reference to FIG. 1. The ohmic-electrode layer 107 may be made of a material that exhibits electrical ohmic-characteristics with the p-type semiconductor layer 106. The ohmic-electrode layer 107 may be formed of a transparent conductive oxide such as ITO, CIO, ZnO, or the like, that has a high level of light transmittance and relatively excellent ohmic-contact performance among materials used for a transparent electrode. Alternatively, the ohmic-electrode layer 107 may be made of a light-reflective material, e.g., a highly reflective metal, and in this case, the semiconductor light emitting device 100 may be used in a so-called flip-chip structure mounted toward a lead frame, or the like, of the first and second electrode 108a and 108b package. Here, the ohmic-electrode layer 107 may not be essential in the present example and may be excluded according to varying circumstances.

The first and second electrodes 108a and 108b may be made of a conventional material having electrical conductivity. For example, the first and second electrodes 106a and 106b may be formed by depositing, sputtering, or the like, one or more of silver (Ag), aluminum (Al), nickel (Ni), chromium (Cr), and the like. In the structure illustrated in FIG. 1, the first and second electrodes 108a and 108b are disposed on the n-type semiconductor layer 102 and the ohmic-electrode layer 107, respectively, but such an electrode (108a, 108b) scheme is merely an example, and electrodes may be disposed in various positions of the light emitting structure including the n-type semiconductor layer 102, the active layer 103, and the p-type semiconductor layer 106 as shown in the example of FIG. 8.

Figure 4:
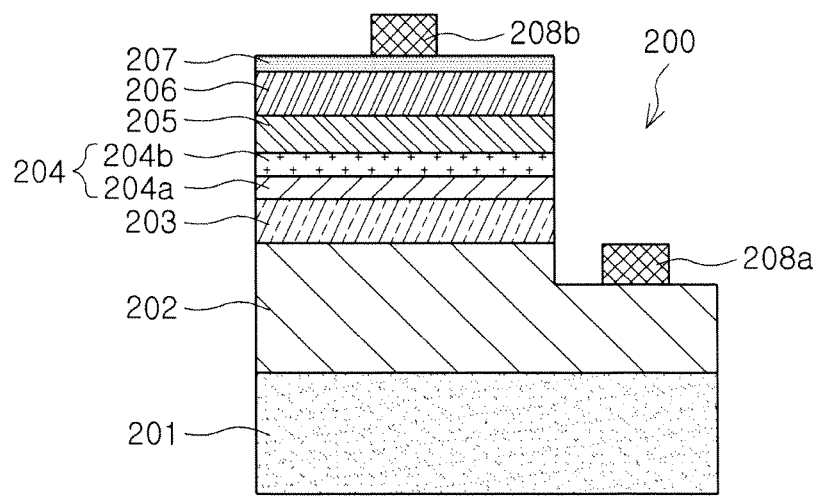
FIG. 4 is a cross-sectional view schematically showing a semiconductor light emitting device according to another example of the present application.

FIG. 4 is a cross-sectional view schematically showing a semiconductor light emitting device according to another example of the present application. With reference to FIG. 4, the semiconductor light emitting device 200 includes a substrate 201, an n-type semiconductor layer 202, an active layer 203, a capping layer 204, an electron blocking layer 205, a p-type semiconductor layer 206, and an ohmic-electrode layer 207. First and second electrodes 208a and 208b may be disposed on upper surfaces of the n-type semiconductor layer 202 and the ohmic-electrode layer 207, respectively.

The present example is different from the former example in that, the capping layer 204 may include first and second layers 204a and 204b, and the first layer 204a may be disposed to be in contact with the active layer 203 and the second layer 204b is disposed between the first layer 204a and the electron blocking layer 205 and may be made of a material having an energy band gap lower than that of the first layer 204a. For example, the first layer 204a may include a region made of $Al_xGa_{1-x}N$ (0<x≤1) and the second layer 204b may include a region made of GaN. Also, the first layer 204a and the second layer 204b may include indium (In). For example, the first layer 204a may include a region made of $Al_xIn_yGa_{1-x-y}N$ (0<x≤1, 0≤y<1) and the second layer 204b may include a region made of $Al_aIn_bGa_{1-a-b}N$ (0≤a<x, 0≤x<1). In the present example, a portion of the capping layer 204 does not contain aluminum (Al) and a portion of the capping layer 204 is changed to have a material having a relatively low energy band gap although the diffusion blocking function is slightly reduced, in consideration of crystallinity.

Figure 5:
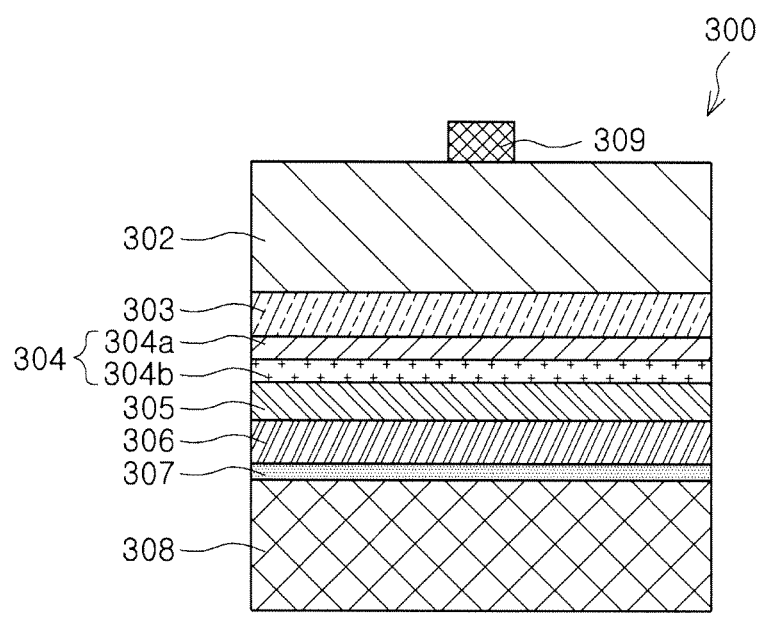
FIG. 5 is a cross-sectional view schematically showing a nitride semiconductor light emitting device according to another example of the present application.

FIG. 5 is a cross-sectional view schematically showing a nitride semiconductor light emitting device according to another example of the present application. In the nitride semiconductor light emitting device 300 according to the present example, a light emitting structure is disposed on a conductive substrate 308, and the light emitting structure includes an n-type semiconductor layer 302, an active layer 303, a capping layer 304, an electron blocking layer 305, and a p-type semiconductor layer 306. In this case, the capping layer 304 may include a first layer 304a and a second layer 304b and have the same structure as described above in the former examples, thus effectively blocking diffusion of a p-type impurity. However, in the present example, the capping layer 304 is employed based on the structure described above with reference to FIG. 4, but the structure described above with reference to FIG. 1 may also be used.

An n-type electrode 309 is disposed on the n-type semiconductor layer 302, and a reflective metal layer 307 and a conductive substrate 308 may be formed under the p-type semiconductor layer 306. The reflective metal layer 307 may be made of a material having electrically ohmic-characteristics with the p-type semiconductor layer 306, and here, the material may be a metal having high reflectivity to reflect light emitted from the active layer 303. In consideration of this function, the reflective metal layer 307 may be formed to include a material such as silver (Ag), nickel (Ni), aluminum (Al), rhodium (Rh), palladium (Pd), iridium (Ir), ruthenium (Ru), magnesium (Mg), zinc (Zn), platinum (Pt), gold (Au), or the like.

The conductive substrate 308 may be connected to external power to apply an electrical signal to the p-type semiconductor layer 306. Also, the conductive substrate 308 may serve as a support supporting the light emitting structure during a process such as a laser lift-off process, or the like, for removing a substrate used for a semiconductor growth, and may be made of a material including any one of gold (Au), nickel (Ni), aluminum (Al), copper (Cu), tungsten (W), silicon (Si), selenium (Se), and GaAs, e.g., a material doped with aluminum (Al) on a silicon (Si) substrate. In this case, the conductive substrate 308 may be disposed on the reflective metal layer 307 through a process such as plating, sputtering, deposition, or the like, and alternatively, a previously fabricated conductive substrate 308 may be joined to the reflective metal layer 307 by the medium of a conductive adhesive layer, or the like.

As set forth above, according to examples of the application, a semiconductor light emitting device having a capping structure in which the p-type dopant diffused into the active layer is blocked to thereby enhance doping efficiency of the p-type semiconductor layer and minimize a degradation of crystal quality and hole injection efficiency can be obtained.

However, the effect that can be obtained from the present application is not limited thereto and any object and effect that can be recognized from the technical solutions and examples described hereinabove may be included although not clarified.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

What is claimed is:

1. A semiconductor light emitting device comprising:
   n-type and p-type semiconductor layers;
   an active layer disposed between the n-type and p-type semiconductor layers and having one or more quantum well layers and one or more quantum barrier layers that are alternately disposed;
   an electron blocking layer disposed between the active layer and the p-type semiconductor layer, the electron blocking layer includes a barrier layer made of AlGaN; and
   a capping layer disposed between the active layer and the electron blocking layer, the capping layer blocking a p-type dopant element from being injected into the active layer,
   wherein the capping layer is made of an undoped semiconductor layer and includes a first layer and a second layer having an energy band gap lower than that of the first layer, and
   wherein the first layer includes a region made of $Al_xIn_yGa_{1-x-y}N$ (0 <x ≤1, 0 <y <1), and the second layer includes a region made of $Al_aIn_bGa_{1-a-b}N$ (0 <a <x, 0 <b <1).

2. The semiconductor light emitting device of claim 1, wherein:
   the first layer is disposed to be in contact with the active layer, and
   the second layer is disposed between the first layer and the electron blocking layer.

3. The semiconductor light emitting device of claim 1, wherein the electron blocking layer has a material having an energy band gap higher than that of the p-type semiconductor layer.

4. The semiconductor light emitting device of claim 1, wherein the capping layer is made of a material having a lattice constant smaller than that of a material used to form the quantum barrier layer.

5. The semiconductor light emitting device of claim 4, wherein the capping layer is made of a material having an energy band gap higher than that of the material used to form the quantum barrier layer.

6. The semiconductor light emitting device of claim 4, wherein:
   the quantum barrier layer includes a region made of GaN.

7. The semiconductor light emitting device of claim 4, wherein:
   the quantum barrier layer includes a region made of $Al_cIn_dGa_{1-c-d}N$ (0 ≤c <x, 0 ≤d <1).

8. The semiconductor light emitting device of claim 1, wherein the electron blocking layer further includes a well layer made of GaN, wherein the well layer has a different energy band gap from the barrier layer, and
   wherein the barrier layer and the well layer are alternately laminated.

9. The semiconductor light emitting device of claim 8, wherein the electron blocking layer has a superlattice structure in which two or more layers of the barrier layer and the well layer are alternately laminated.

10. A semiconductor light emitting device comprising:

a first conductivity type semiconductor layer;

a second conductivity type semiconductor layer;

an active layer disposed between the first conductivity type and second conductivity type semiconductor layers and having one or more quantum well layers and one or more quantum barrier layers that are alternately disposed;

an electron blocking layer disposed between the active layer and the second conductivity type semiconductor layer; and a capping layer disposed between the active layer and the electron blocking layer, the capping layer blocking a dopant element from being injected into the active layer from the second conductivity type semiconductor layer, wherein the capping layer is made of an undoped semiconductor layer and includes a first layer and a second layer having an energy band gap lower than that of the first layer, and wherein the first layer includes a region made of $Al_xIn_yGa_{1-x-y}N$ ($0 < x \leq 1$, $0 < y < 1$), and the second layer includes a region made of $Al_aIn_bGa_{1-a-b}N$ ($0 < a < x$, $0 < b < 1$).

11. The semiconductor light emitting device of claim 10, wherein the capping layer is made of a material having a lattice constant smaller than that of a material used to form the quantum barrier layer.

12. The semiconductor light emitting device of claim 11, wherein the capping layer is made of a material having an energy band gap higher than that of the material used to form the quantum barrier layer.

13. The semiconductor light emitting device of claim 11, wherein:

the quantum barrier layer includes a region made of $Al_cIn_dGa_{1-c-d}N$ ($0 \leq c < x$, $0 \leq d < 1$).

* * * * *